US008557405B2

(12) United States Patent
Shibata et al.

(10) Patent No.: US 8,557,405 B2
(45) Date of Patent: Oct. 15, 2013

(54) COATED MEMBER

(75) Inventors: Miho Shibata, Iwaki (JP); Katsuhisa Ohtomo, Iwaki (JP)

(73) Assignee: Tungaloy Corporation, Iwaki-shi, Fukushima (JP)

(*) Notice: Subject to any disclaimer, the term of this patent is extended or adjusted under 35 U.S.C. 154(b) by 155 days.

(21) Appl. No.: 13/388,622

(22) PCT Filed: Aug. 4, 2010

(86) PCT No.: PCT/JP2010/063192
§ 371 (c)(1),
(2), (4) Date: Feb. 2, 2012

(87) PCT Pub. No.: WO2011/016488
PCT Pub. Date: Feb. 10, 2011

(65) Prior Publication Data
US 2012/0128971 A1 May 24, 2012

(30) Foreign Application Priority Data

Aug. 4, 2009 (JP) ................................. 2009-181826

(51) Int. Cl.
*B32B 9/00* (2006.01)
*C23C 14/06* (2006.01)

(52) U.S. Cl.
USPC .......... 428/697; 51/307; 51/309; 204/192.12; 204/192.15; 204/192.16; 428/336; 428/698; 428/699

(58) Field of Classification Search
USPC ............ 51/307, 309; 428/336, 697, 698, 699; 204/192.12, 192.15, 192.16
See application file for complete search history.

(56) References Cited

U.S. PATENT DOCUMENTS 6,274,249 B1 * 8/2001 Braendle et al. ............... 428/699
6,824,601 B2 * 11/2004 Yamamoto et al. ........... 428/698
(Continued)

FOREIGN PATENT DOCUMENTS

JP 2-194159 7/1990
JP 8-209333 8/1996
(Continued)

OTHER PUBLICATIONS

Ide et al.; "Development of Al-Cr-N films Excellent in High-Temperature Oxidation Resistance"; Materia, col. 40, No. 9, 2001, pp. 815-816.

(Continued)

*Primary Examiner* — Archene Turner
(74) *Attorney, Agent, or Firm* — Womble Carlyle

(57) ABSTRACT

A coated member includes a base material and a coating film formed on the surface thereof. At least one layer in the coating film is a hard film of a cubic metal compound including at least one element selected from the group consisting of the group 4 elements (Ti, Zr, Hf, etc.), group 5 elements (V, Nb, Ta, etc.) and group 6 elements (Cr, Mo, W, etc.) of the periodic table, Al, Si, B, Y and Mn together with at least one element selected from the group consisting of C, N and O. In the pole figure for the face (111) of the hard film, the X-ray intensity distribution in the α-axis shows the maximum intensity in the α-angle range of 50-65°. In the pole figure for the face (200), the X-ray intensity distribution in the α-axis shows the maximum intensity in the α-angle range of 60-80°.

20 Claims, 5 Drawing Sheets

(56) References Cited

U.S. PATENT DOCUMENTS

| | | | |
|---|---|---|---|
| 6,844,069 B2 * | 1/2005 | Braendle et al. | 428/698 |
| 7,056,602 B2 * | 6/2006 | Horling et al. | 51/307 |
| 7,166,155 B2 * | 1/2007 | Ishikawa | 428/697 |
| 7,794,860 B2 * | 9/2010 | Okamura et al. | 428/698 |
| 8,025,956 B2 * | 9/2011 | Yamamoto et al. | 428/698 |
| 8,507,108 B2 * | 8/2013 | Larsson et al. | 51/309 |
| 2002/0168552 A1 | 11/2002 | Yamamoto et al. | |

FOREIGN PATENT DOCUMENTS

| | | |
|---|---|---|
| JP | 2005-219199 | 8/2005 |
| JP | 2005-271106 | 10/2005 |
| JP | 2007-203447 | 8/2007 |
| JP | 2007-254785 * | 10/2007 |
| JP | 2008-031517 | 2/2008 |
| JP | 2008-240079 | 10/2008 |
| JP | 2009-197268 | 9/2009 |
| JP | 2009-203485 | 9/2009 |
| JP | 2009-203489 | 9/2009 |
| WO | 2010-007958 | 1/2010 |

OTHER PUBLICATIONS

Reiter et al., "Investigation of the properties of Al-Cr-N coatings prepared by cathodic arc evaporation", Surface and Coating Technology, vol. 200, 2005, pp. 2114-2122.

International Search Report in PCT/JP2010/063192, dated Sep. 7, 2010.

International Preliminary Report on Patentability issued Feb. 16, 2012 in counterpart PCT Application No. PCT/JP2010/063192 (with English translation).

* cited by examiner

COATED MEMBER

RELATED APPLICATIONS

This is a 371 US National Phase of International Patent Application No. PCT/JP2010/063192, filed Aug. 4, 2010, and published as WO 2011/016488 A1 on Feb. 10, 2011, which claims priority to JP 2009-181826, filed Aug. 4, 2009. The contents of the aforementioned applications are incorporated by reference in their entirety.

TECHNICAL FIELD

The present invention relates to a coated member in which a coating is coated on a surface of a substrate such as a sintered alloy, ceramics, cBN sintered compact, diamond sintered compact, etc. In particular, it relates to a coated member suitable for a cutting tool represented by a cutting insert, drill and end mill, various kinds of wear resistant tools, and various kinds of wear resistant parts.

BACKGROUND ART

A coated member in which a coating such as TiC, TiCN, TiN, (Ti,Al)N, CrN, etc., is coated on the surface of a substrate such as a sintered alloy, ceramics, cBN sintered compact, diamond sintered compact, etc., is frequently used as a cutting tool, wear resistant tool, wear resistant parts since they have both of high strength and high toughness of the substrate, and excellent wear resistance, oxidation resistance, lubricity, welding resistance, etc., of the coating in combination.

As a prior art concerning the coating, there is a hard film for a cutting tool comprising (Ti,Al,Cr)(C,N) (for example, see Patent Literature 1.). Also, as a film excellent in oxidation resistance, there is an Al—Cr—N series film (for example, see Non-Patent Literature 1.). However, due to variation of a work piece material, cutting conditions, etc., in the cutting tools in which these films are coated, there is a problem that long life-time cannot be obtained.

[Patent Literature 1] JP 2003-71610A

[Non-Patent Literature 1] Yukio Ide, Kazunori Inada, Takashi Nakamura, Katsuhiko Kishitake, "Development of Al—Cr—N films excellent in high-temperature oxidation resistance", "MATERIA", vol. 40, No. 9, 2001, p. 815-816

DISCLOSURE OF THE INVENTION

Problems to be Solved by the Invention

In recent years, in cutting, severe cutting conditions such as high-speed cutting, high-feed-rate cutting, etc., or severe cutting conditions such as higher hardness of a work piece material, etc., are increasing, so that a further elongation of lifetime tends to be required to coated tools. However, the conventional coated tools could not endure these severe requirements for cutting. The present invention has been made in view of such a circumstance, and an object thereof is to provide a coated member which realizes a long life-time in a cutting with severe cutting conditions such as high-speed cutting, high-feed-rate cutting, cutting of difficultly cutting materials, etc.

Means to Solve the Problems

In the conventional cutting, a cutting tool comprising a coated member in which a hard film comprising a cubic metallic compound such as (TiAl)N, (TiCr)N, (CrAl)N, (TiAlCr)N, etc., is coated on the surface of a substrate has been used. The present inventors have earnestly studied to improve properties of a coated member in which (TiAl)N, (TiCr)N, (CrAl)N, (TiAlCr)N, etc., is coated on the surface of a substrate. As a result, they have obtained findings that measurement of the pole figure for the (111) plane and the (200) plane of the hard film is carried out by an X-ray diffraction, and when an X-ray intensity distribution of an α axis in the pole figure for the (111) plane of the hard film shows the maximum intensity of an α angle in the range of 50 to 65° and an X-ray intensity distribution of an α axis in the pole figure for the (200) plane of the hard film shows the maximum intensity of an α angle in the range of 60 to 80°, wear resistance is improved, and when it is used as a cutting tool, it becomes long lifetime.

That is, the coated member of the present invention comprises a coated member in which a coating is coated on the surface of a substrate, wherein at least one layer of the coating is a hard film comprising a cubic metallic compound which comprises at least one element selected from the elements of the Group 4, 5 and 6 of the Periodic Table, Al, Si, B, Y and Mn, and at least one element selected from C, N and O, and is a coated member in which an X-ray intensity distribution of an α axis in the pole figure for the (111) plane of the hard film has a maximum intensity in the α angle range of 50 to 65°, and an X-ray intensity distribution of an α axis in the pole figure for the (200) plane of the hard film has a maximum intensity in the α angle range of 60 to 80°.

Effects of the Invention

The hard film of the present invention is excellent in adhesiveness to the substrate, and excellent in wear resistance. The coated member of the present invention is excellent in wear resistance, fracture resistance and oxidation resistance. When the coated member of the present invention is used as a cutting tool, then, an effect of elongating tool lifetime can be obtained. In particular, it shows higher effect in cutting in which cutting conditions are severe such as high-speed cutting, high-feed-rate cutting, cutting of a work piece material with high hardness, cutting of difficultly cutting materials, etc.

EXPLANATION OF THE REFERENCE NUMERALS

1 . . . Dissipation slit (DS)
2 . . . Center of the sample

3 . . . Divergence vertical limit slit (Schulz slit)
4 . . . Light receiving slit (RS)
5 . . . Scattering slit (SS)
6 . . . Counter

EMBODIMENTS TO CARRY OUT THE INVENTION

The present inventors have studied distribution of angles of inclination of a cubic (111) plane and distribution of angles of inclination of a (200) plane constituting the hard film by measurement of the pole figure, and by controlling these values to specific ranges, wear resistance could be improved as compared with that of the conventional hard film.

When measurement of an X-ray diffraction in the pole figure of the hard film of the present invention is carried out, an X-ray intensity distribution of an α axis in the pole figure for the (111) plane of the hard film has a maximum intensity in the α angle range of 50 to 65°, and an X-ray intensity distribution of an α axis in the pole figure for the (200) plane of the hard film has a maximum intensity in the α angle range of 60 to 80°. Among these, it is more preferred that an X-ray intensity distribution of an α axis in the pole figure for the (111) plane of the hard film has a maximum intensity in the α angle range of 50 to 65°, and an X-ray intensity distribution of an α axis in the pole figure for the (200) plane of the hard film has a maximum intensity in the α angle range of 65 to 75°. This shows that, among the cubic crystals constituting the hard film, amounts of crystals in which the (111) plane is inclined about 60° to the surface of the coated member, and crystals in which the (200) plane is inclined about 70° to the surface of the coated member are large. Wear resistance of the above can be improved as compared with a coated member which shows the maximum intensity of the X-ray intensity distribution of an α axis in the pole figure for the (111) plane of the hard film at the α angle of less than 50° or the α angle of exceeding 65°, or a coated member which shows the maximum intensity of the X-ray intensity distribution of an α axis in the pole figure for the (200) plane of the hard film at the α angle of less than 60° or at the α angle of exceeding 80°.

Figure 1:
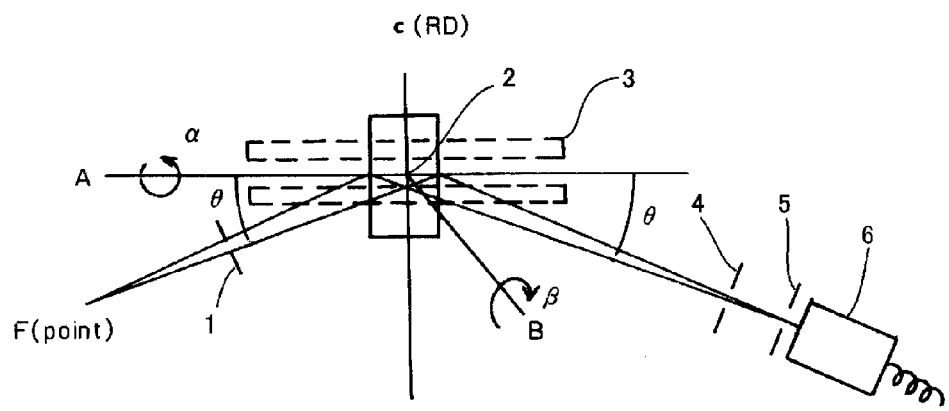
FIG. 1 It is a schematic drawing showing optically system of the Schulz reflection method.
Figure 2:
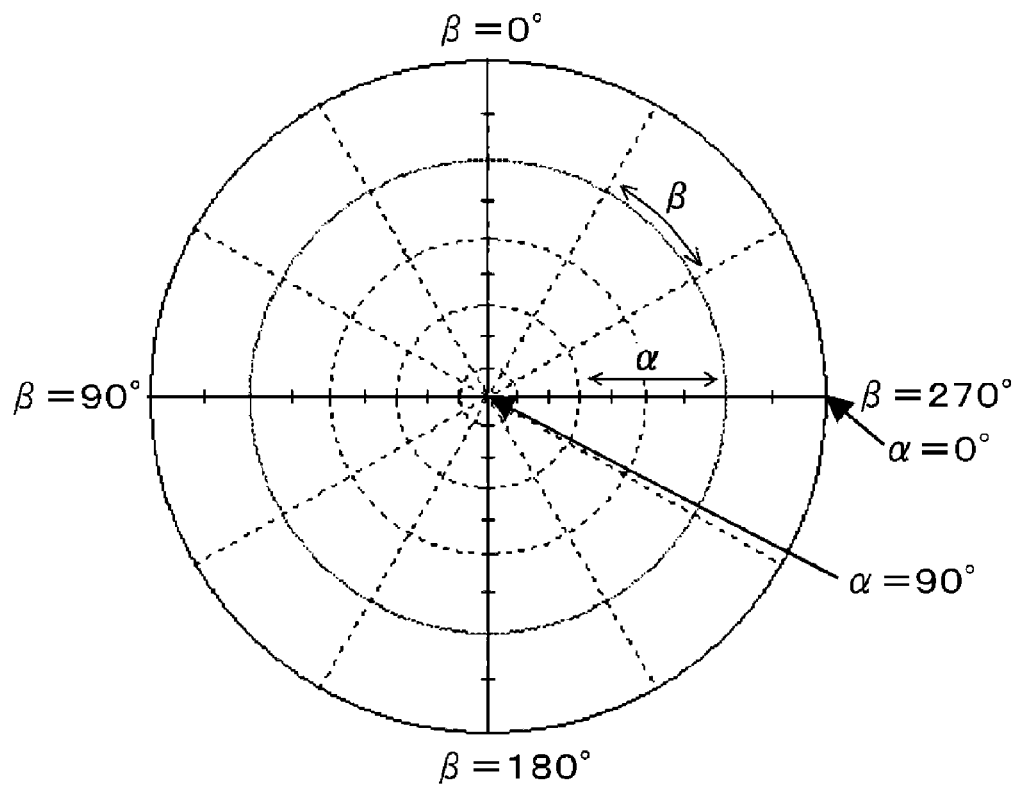
FIG. 2 It is a pole figure showing the positions of an α angle and a β angle.
Figure 3:
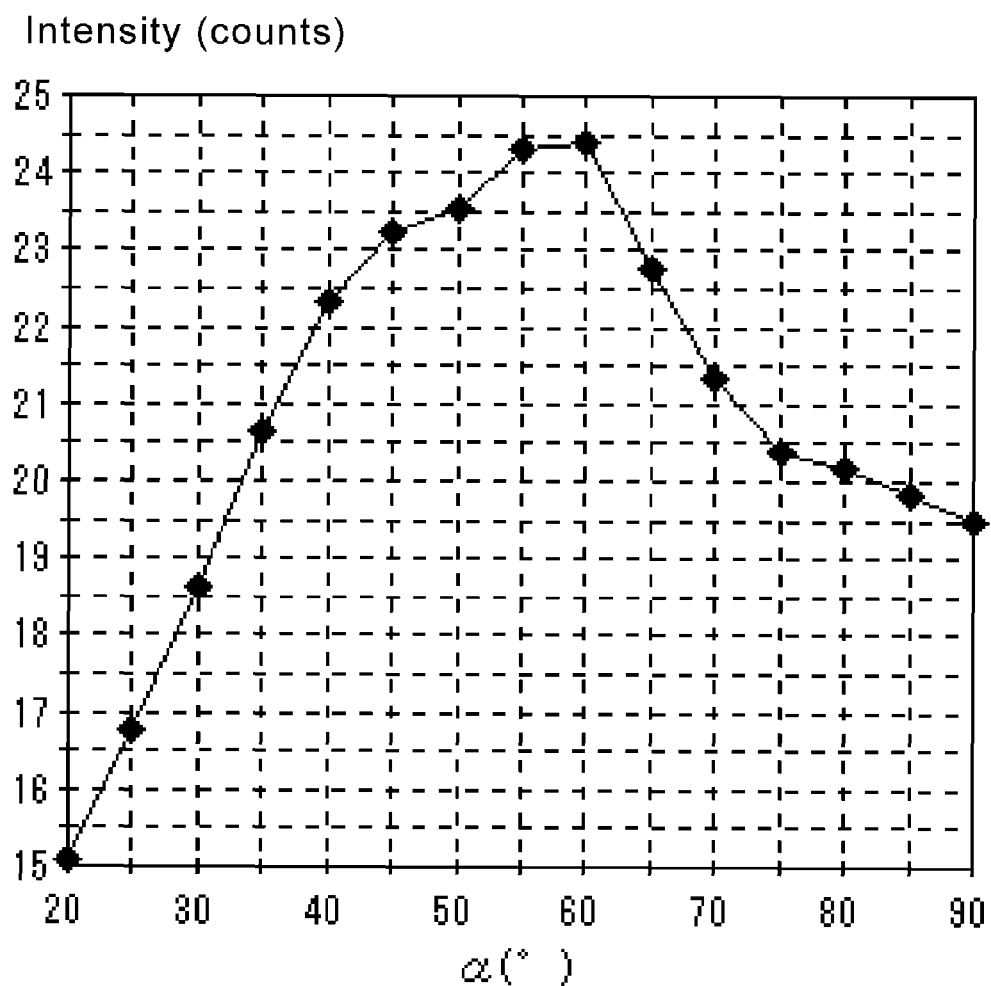
FIG. 3 It is a drawing showing an X-ray intensity distribution of an α axis in the pole figure for the (111) plane of the hard film of the present product 1.
Figure 4:
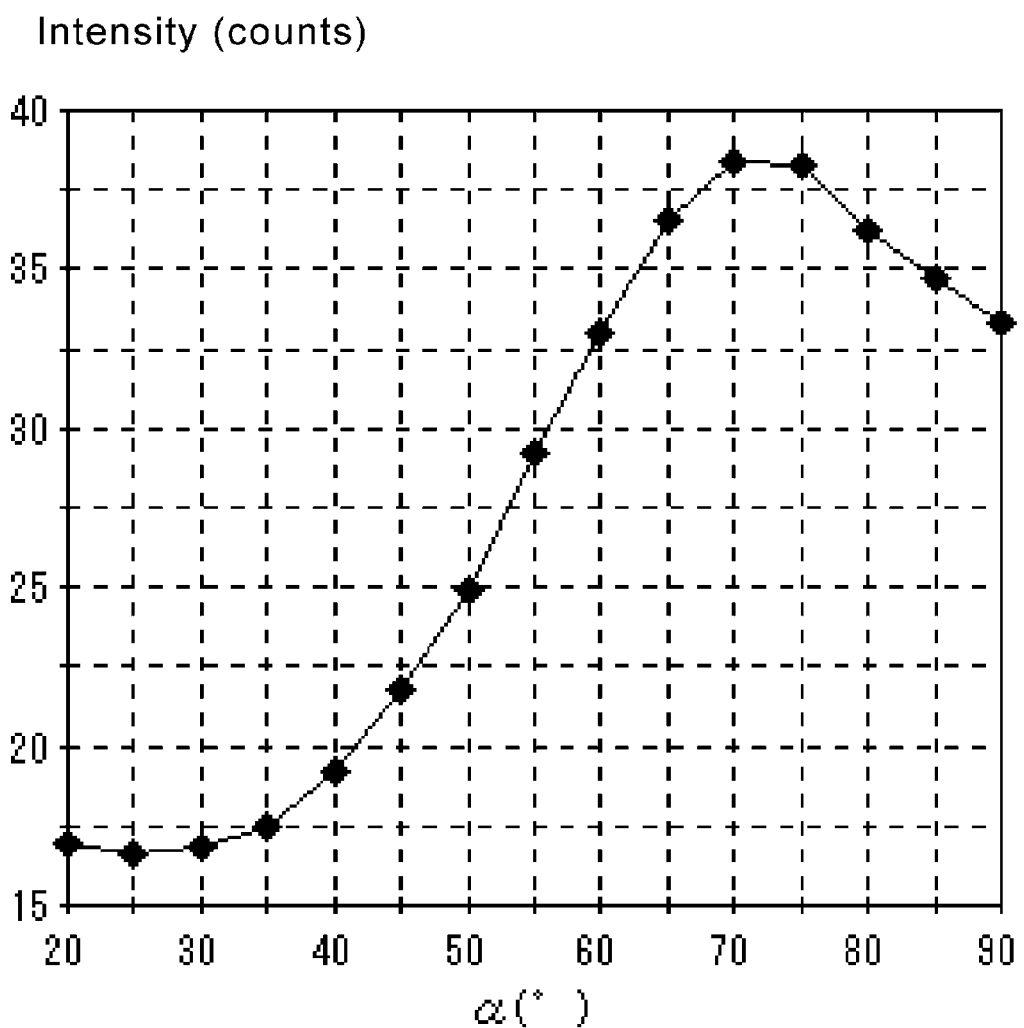
FIG. 4 It is a drawing showing an X-ray intensity distribution of an α axis in the pole figure for the (200) plane of the hard film of the present product 1.
Figure 5:
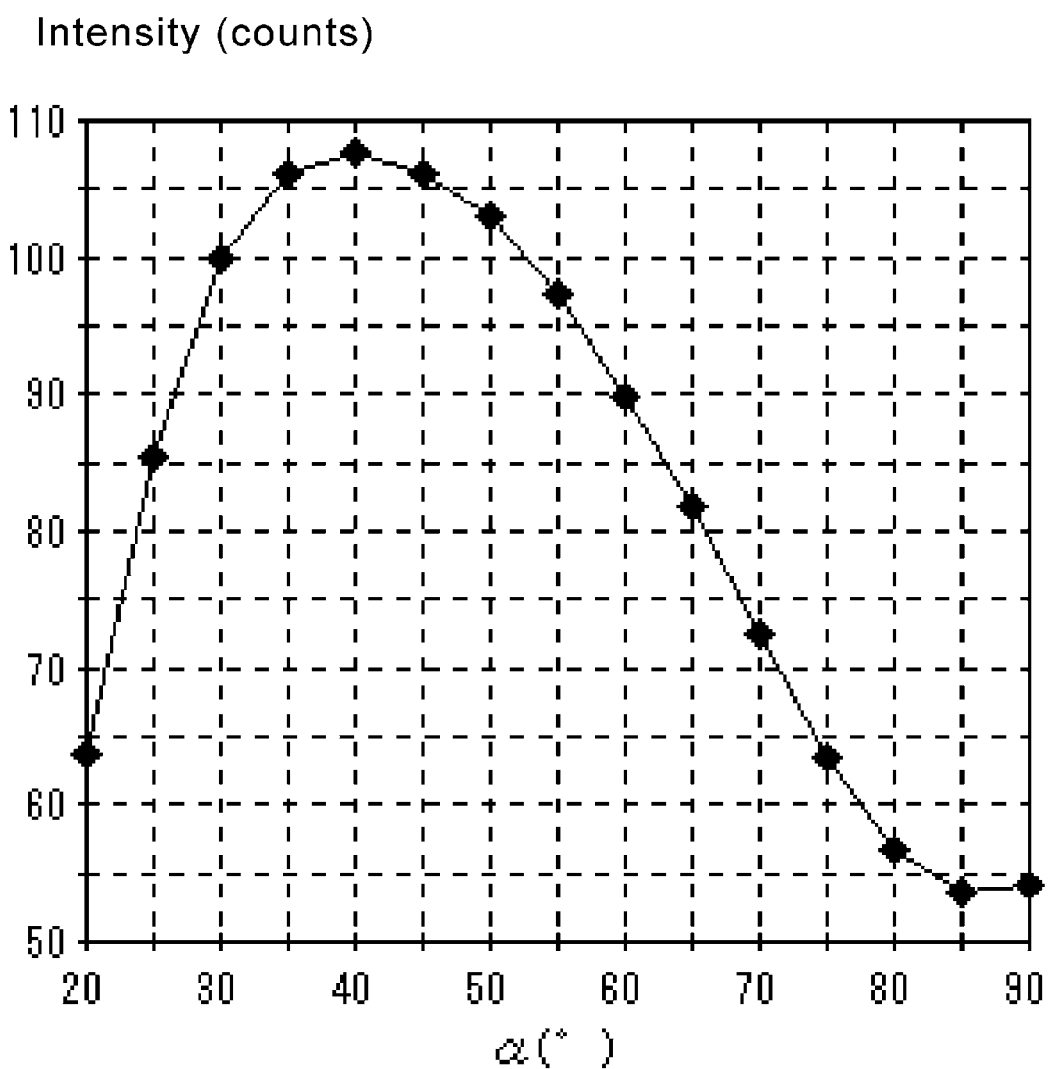
FIG. 5 It is a drawing showing an X-ray intensity distribution of an α axis in the pole figure for the (111) plane of the hard film of Comparative product 1.
Figure 6:
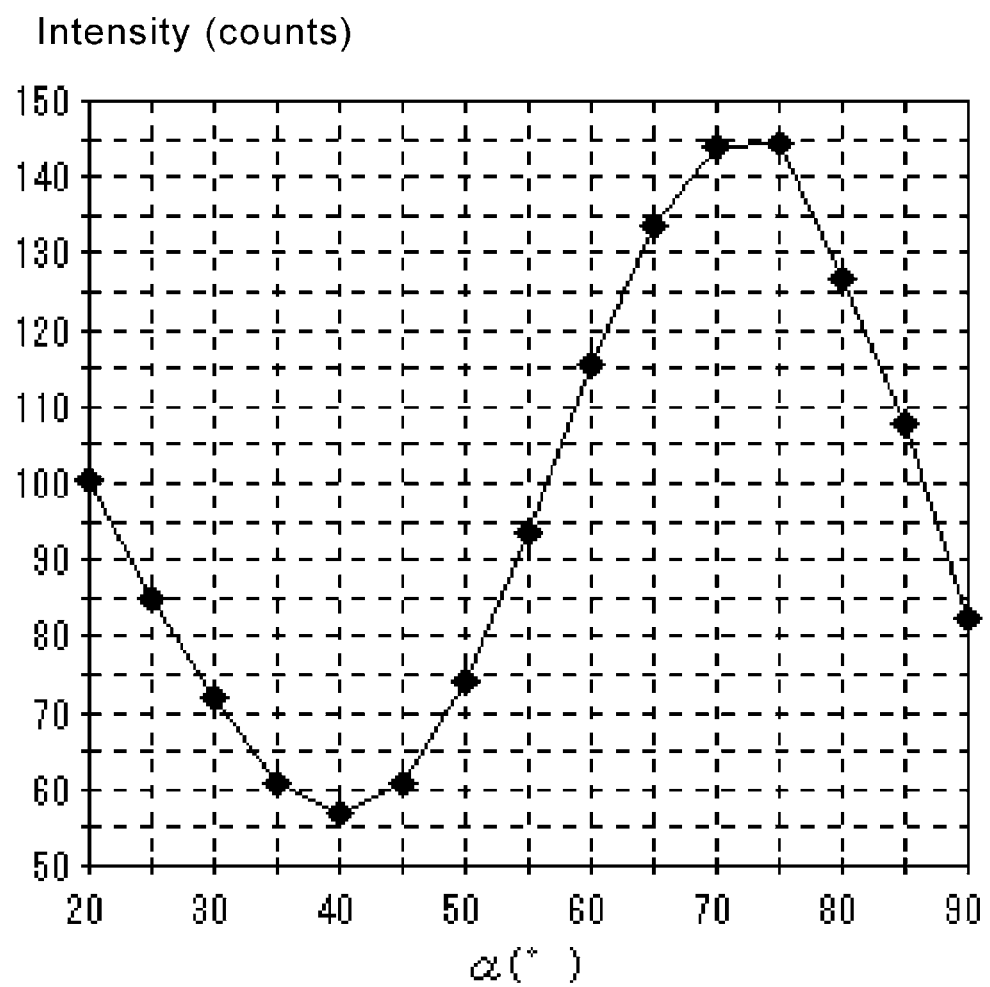
FIG. 6 It is a drawing showing an X-ray intensity distribution of an α axis in the pole figure for the (200) plane of the hard film of Comparative product 1.

The X-ray intensity distribution of an α axis in the pole figure for the (111) plane and the (200) plane of the hard film of the present invention can be measured by the Schulz reflection method. The Schulz reflection method is, as shown in FIG. 1, a method for measuring an intensity distribution of a diffraction line by changing a direction of a sample to the incident X ray according to an α rotation which is made an A axis in the sample surface a center, and a β rotation which is made a normal (B axis) of the sample surface a center, i.e., a rotation in the sample surface, using an optical system of reflection with equal angles in which 2θ is a diffraction angle, and an angle of incident and an angle of reflection are each θ. When B axis is on a plane determined by an incident line and a diffraction line, then, the α angle is defined to be 90°. When the α angle is 90°, it becomes a center point on the pole figure as shown in FIG. 2. As a specific measurement method, for example, by using a pole measurement program of an X ray diffraction analyzer RINT-TTR III available from RIGAKU CORPORATION, an X-ray intensity distribution of an α axis in the pole figure for the (111) plane and the (200) plane of the hard film can be measured by the following mentioned measurement conditions and measurement method.

[Measurement Conditions]
(1) TTR III level goniometer
(2) Multipurpose measurement attachment for pole
(3) Scanning method: concentric circle
(4) β scanning range: 0 to 360°/5° pitch
(5) β scanning speed: 180°/min
(6) γ amplitude: 0 mm

[Measurement Method (Schulz Reflection Method)]
(1) θ fixed angle: a diffraction angle for the (111) plane of the hard film is made an angle in which the diffraction intensity becomes the highest between 36.0° and 37.5°, and a diffraction angle for the (200) plane of the hard film is made an angle in which the diffraction intensity becomes the highest between 42.0° and 44.0°.
(2) α scanning range: 20 to 90° (5° step)
(3) Target: Cu, Voltage: 50 kV, Current: 250 mA
(4) Dissipation slit: ¼°
(5) Scattering slit: 6 mm
(6) Divergence vertical limit slit: 5 mm Whereas an α angle showing the maximum intensity can be read from a contour line of the pole figure for the (111) plane and the (200) plane, the α angle showing the maximum intensity can be easily obtained from an X-ray intensity distribution of an α axis in the pole figure for the (111) plane and the (200) plane.

As a substrate of the coated member of the present invention, there may be more specifically mentioned a sintered alloy, ceramics, cBN sintered compact, diamond sintered compact, etc. Of these, a sintered alloy is preferred since it is excellent in fracture resistance and wear resistance, and of these, a cermet and a cemented carbide are more preferred, and a cemented carbide is particularly preferred among these.

The coating of the present invention is constituted by a metallic compound film comprising at least one element selected from the elements of Groups 4 (Ti, Zr, Hf, etc.), 5 (V, Nb, Ta, etc.) and 6 (Cr, Mo, W, etc.) of the Periodic Table, and Al, Si, B, Y and Mn, and at least one element selected from C, N and O, and there may be more specifically mentioned TiC, TiCN, TiCNO, TiN, (TiAl)N, (CrAl)N, $Al_2O_3$, $(CrAl)_2O_3$, (AlTiSi)N, (AlCrW)N, (TiAl)BN, (HfAlMn)N, (TiSi)N, (ZrAl)CN, (TiNb)BN, etc. At least one of the coatings of the present invention is a hard film. The coating of the present invention contains both of layer constitutions including a single film consisting of a hard film, and two or more plural layers comprising a hard film and a film other than the hard film. If the whole average film thickness of the coating of the present invention is 0.1 μm or more, wear resistance and oxidation resistance are improved, while if it exceeds 15 μm, fracture resistance is lowered. Thus, the average film thickness of the coating of the present invention is preferably in the range of 0.1 to 15 μm, and among these, it is more preferably in the range of 0.5 to 10 μm, further preferably in the range of 0.7 to 8 μm, particularly preferably in the range of 1 to 5 μm.

The hard film of the present invention comprises a cubic metallic compound which comprises at least one element selected from the elements of Groups 4 (Ti, Zr, Hf, etc.), 5 (V, Nb, Ta, etc.) and 6 (Cr, Mo, W, etc.) of the Periodic Table, and Al, Si, B, Y and Mn, and at least one element selected from C, N and O. Among these, preferred is a cubic metallic compound comprising at least one metal element selected from Al, Ti, Cr and Si, and at least one non-metal element selected from C, N and O, since it has high hardness and excellent wear resistance. Among these, more preferred is a material comprising a nitride of at least one metal element selected from Al, Ti, Cr and Si. There may be more specifically mentioned TiN, TiC, TiCN, TiCNO, (TiNb)N, (TiZr)CN, (AlTi)N, (AlTi)C, (AlTi)(CN), (AlTi)(CNO), (AlCr)N, (AlCr)C, (AlCr)(CN), (AlCr)(CNO), (AlTiCr)N, (AlTiCr)C, (AlTiCr)(CN), (AlTiCr)(CNO), (AlTiSi)N, (AlTiSi)C, (AlTiSi)(CN), (AlTiSi)(CNO), (AlTiCrSi)N, (AlTiCrSi)C, (AlTiCrSi)(CN), (AlTiCrSi)(CNO), etc. If an average film thickness of the hard film of the present invention exceeds 0.1 μm or more, wear resistance and oxidation resistance are improved, while if it exceeds 15 μm, fracture resistance is lowered. Thus, the average film thickness of the hard film of the present invention is preferably in the range of 0.1 to 15 μm, and among these, it is more preferably in the range of 0.5 to 10 μm, further preferably in the range of 0.7 to 8 μm, particularly preferably in the range of 1 to 5 μm.

Among these, the hard film of the present invention is preferably a metallic compound represented by $(Al_aJ_b)(C_xN_y)$ (wherein J represents one or both of Ti and Cr, a represents an atomic ratio of Al based on the sum of Al and J, b represents an atomic ratio of J based on the sum of Al and J, a and b satisfy $a+b=1$, $0.5 \le a \le 0.7$ and $0.3 \le b \le 0.5$, x represents an atomic ratio of C based on the sum of C and N, y represents an atomic ratio of N based on the sum of C and N, and both satisfy $x+y=1$, $0 \le x \le 1$ and $0 \le y \le 1$.). This is due to the following reasons. If a is 0.5 or more, and b is 0.5 or less, hardness of the hard film becomes high and wear resistance is improved. On the other hand, if a exceeds 0.7, and b is less than 0.3, a metallic compound other than cubic crystal is likely formed, whereby hardness of the hard film is lowered and wear resistance is also lowered. Also, when the non-metal element comprises one or both of C and N, fracture resistance or chipping resistance is improved. There may be more specifically mentioned $(Al_{0.50}Ti_{0.50})N$, $(Al_{0.55}Ti_{0.45})N$, $(Al_{0.60}Ti_{0.40})N$, $(Al_{0.70}Ti_{0.30})N$, $(Al_{0.60}Ti_{0.20}Cr_{0.20})N$, $(Al_{0.50}Cr_{0.50})N$, etc.

The hard film of the present invention is preferably a metallic compound represented by $(Al_cJ_dSi_e)(C_zN_w)$ (wherein J represents one or both of Ti and Cr, c represents an atomic ratio of Al based on the sum of Al, J and Si, d represents an atomic ratio of J based on the sum of Al, J and Si, e represents an atomic ratio of Si based on the sum of Al, J and Si, c, d and e satisfy $c+d+e=1$, $0.3 \le c \le 0.6$, $0.3 \le d \le 0.6$ and $0.01 \le e \le 0.1$, z represents an atomic ratio of C based on the sum of C and N, w represents an atomic ratio of N based on the sum of C and N, and each satisfy $z+w=1$, $0 \le z \le 1$ and $0 \le w \le 1$.). This is due to the following reasons. If c is 0.3 or more, d is 0.6 or less, and e is 0.01 or more, hardness of the hard film becomes higher and wear resistance is improved. On the other hand, if c exceeds 0.6, and d is less than 0.3, a metallic compound other than cubic crystal is likely formed, and if e exceeds 0.1, an effect of adding Si to heighten hardness is lowered, so that hardness of the hard film becomes low and wear resistance is lowered. Also, when the non-metal element comprises one or both of C and N, fracture resistance or chipping resistance is improved. There may be more specifically mentioned $(Al_{0.45}Ti_{0.40}Si_{0.15})N$, $(Al_{0.55}Ti_{0.35}Si_{0.10})N$, $(Al_{0.60}Ti_{0.35}Si_{0.05})N$, $(Al_{0.30}Cr_{0.30}Ti_{0.30}Si_{0.10})N$, $(Al_{0.45}Cr_{0.30}Ti_{0.20}Si_{0.05})N$, $(Al_{0.55}Ti_{0.30}Cr_{0.10}Si_{0.05})N$, $(Al_{0.60}Ti_{0.29}Cr_{0.10}Si_{0.01})N$, $(Al_{0.55}Ti_{0.05}Cr_{0.3}Si_{0.1})(C_{0.5}N_{0.5})$, $(Al_{0.4}Ti_{0.4}Cr_{0.15}Si_{0.05})(C_{0.3}N_{0.7})$, $(Al_{0.5}Ti_{0.38}Cr_{0.08}Si_{0.04})N$, $(Al_{0.55}Ti_{0.4}Si_{0.05})(C_{0.1}N_{0.9})$, etc.

The hard film of the present invention comprises a cubic metallic compound, and among these, it is preferred that a full width at half maximum intensity (FWHM) of the diffraction line of the (200) plane is 0.90 to 1.60° since it is excellent in wear resistance.

With regard to the composition of the coating of the present invention, it can be measured by an elemental analyzer such as a secondary ion mass spectrometry (SIMS), energy dispersive X-ray spectrometer (EDS), glow discharge spectroscopy (GDS), etc.

For the preparation of the hard film of the present invention, for example, an arc ion plating device (hereinafter referred to an AIP device.) can be used, but other devices, for example, a sputtering device may be used. When the AIP device is used, a substrate is charged in the AIP device, a substrate temperature is raised to 500 to 750° C., preferably to 500 to 700° C. by a heater, and after subjecting the substrate to Ar gas bombardment, Ar, $N_2$, $O_2$, $CH_4$, $C_2H_2$ or a mixed gas thereof is introduced therein, a pressure in the AIP device is made 2 to 5 Pa, preferably 2 to 4 Pa, and a hard film is coated according to the first coating step by applying a direct current bias voltage: −20 to −70V, preferably −30 to −60V, more preferably −30 to −45V and an arc discharge current: 80 to 180 A, preferably 100 to 150 A to the substrate to form the hard film corresponding to 3 to 15% of an average film thickness by adjusting the time. According to this procedure, a columnar structure hard film is coated. Thereafter, the substrate temperature is lowered to 450 to 700° C., preferably 450 to 550° C., while maintaining the pressure, gradually applying a substrate bias voltage from −20 to −70V, to the substrate bias voltage of −80 to −180V, preferably −80 to −120V, more preferably −80 to −95V, and a hard film is further coated according to the second coating step of the substrate bias voltage of −80 to −180V, preferably −80 to −120V, more preferably −80 to −95V and an arc discharge current: 130 to 180 A, preferably 150 to 180 A to coat the hard film corresponding to 85 to 97% of the average film thickness by adjusting the time. According to the above method, a hard film which comprises a cubic metallic compound, and the X-ray intensity distribution of an α axis in the pole figure for the (111) plane of which shows the maximum intensity at the α angle range of 50 to 65°, and the X-ray intensity distribution of an α axis in the pole figure for the (200) plane of which shows the maximum intensity at the α angle range of 60 to 80° can be formed.

EXAMPLES

Example 1

As a substrate, an insert made of a cemented carbide corresponding to S10 with a shape of CNMG120408 was prepared. With regard to Present products, a metal target corresponding to a metal element and an Si element of a coating shown in Table 1 was charged in an AIP device. The substrate was charged in the AIP device, a substrate temperature was raised by a heater to 700° C., and Ar gas bombardment was carried out to the substrate. A starting gas(es) selected from Ar, $N_2$, $O_2$ and $CH_4$ depending on the composition of the coating was introduced into the AIP device, and by adjusting a pressure to 3 Pa, coating was carried out by the first coating step at a substrate bias voltage: −20 to −70V, and an arc discharge current: 160 A during the time shown in Table 2. After completion of the coating at the first coating step, while maintaining the pressure, the substrate temperature was lowered to 550° C., and the substrate bias voltage was gradually adjusted from −20 to −70V to −100 to −150V, and coating was carried out by the second coating step at a substrate bias voltage: −100 to −150V, and an arc discharge current: 160 A during the time shown in Table 2.

With regard to Comparative products 1 and 2, a metal target each corresponding to the composition of the metal elements of the film shown in Table 1 was charged in the AIP device, the substrate was placed in the AIP device in the same manner as in Present products, a substrate temperature was raised by a heater to 600° C., and after subjecting to Ar gas bombardment to the substrate in the same manner as in Present products, a mixed gas of Ar and $N_2$ was introduced into the AIP device to adjust a pressure to 2 Pa, and coating was carried out under the coating conditions at a substrate bias voltage: −50V, and an arc discharge current: 150 A to provide a coating.

With regard to the composition of the coating coated on the surface of the substrate, measurement was carried out from the surface of the coating by using an energy dispersive X-ray spectrometer (EDS). With regard to the average film thickness of the coating coated on the surface of the substrate, the respective samples were cut, and the cross-sectional surface obtained by mirror polishing the cross-sectional surface was observed by an optical microscope and measured. These values are also shown in Table 1.

TABLE 1

| | Coating | |
|---|---|---|
| Sample No. | Composition (Atomic ratio) | Average film thickness (μm) |
| Present product 1 | TiCNO | 2 |
| Present product 2 | TiCNO | 1 |
| Present product 3 | $(Ti_{0.55}Nb_{0.45})N$ | 2.5 |
| Present product 4 | $(Ti_{0.60}Zr_{0.40})CN$ | 2 |
| Present product 5 | $(Al_{0.40}Ti_{0.60})N$ | 3 |
| Present product 6 | $(Al_{0.20}Cr_{0.70}Si_{0.10})N$ | 2 |
| Present product 7 | $(Al_{0.45}Ti_{0.40}Si_{0.15})N$ | 3 |
| Comparative product 1 | TiN | 4 |
| Comparative product 2 | $(Al_{0.50}Ti_{0.50})N$ | 3 |

TABLE 2

| | Coating conditions | | | |
|---|---|---|---|---|
| | First coating step | | Second coating step | |
| Sample No. | Substrate bias voltage (V) | Time (min) | Substrate bias voltage (V) | Time (min) |
| Present product 1 | −20 | 10 | −120 | 120 |
| Present product 2 | −70 | 10 | −150 | 60 |
| Present product 3 | −50 | 10 | −100 | 150 |
| Present product 4 | −50 | 12 | −100 | 120 |
| Present product 5 | −60 | 20 | −110 | 180 |
| Present product 6 | −60 | 15 | −130 | 120 |
| Present product 7 | −60 | 15 | −130 | 180 |

With regard to the coatings of Present products 1 to 7 and Comparative products 1 and 2, when X-ray diffraction measurement by the 2θ/θ scanning method was carried out by using an X-ray diffraction analyzer RINT-TTRIII available from RIGAKU CORPORATION, then the coatings of all the samples were confirmed to be a cubic NaCl type structure. Further, an X-ray intensity distribution of an α axis in the pole figure for the (111) plane and the (200) plane of the coatings of the whole samples were measured by using an X-ray diffraction analyzer RINT-TTRIII available from RIGAKU CORPORATION according to the measurement conditions and measurement methods shown below. The measurement results are shown in Table 3.

[Measurement Conditions]
(1) TTR III level goniometer
(2) Multipurpose measurement attachment for pole
(3) Scanning method: concentric circle
(4) β scanning range: 0 to 360°/5° pitch
(5) β scanning speed: 180°/min
(6) γ amplitude: 0 mm
[Measurement Method (Schulz Reflection Method)]
(1) θ fixed angle: a diffraction angle for the (111) plane of the hard film is made an angle in which the diffraction intensity becomes the highest between 36.0° and 37.5°, and a diffraction angle for the (200) plane of the hard film is made an angle in which the diffraction intensity becomes the highest between 42.0° and 44.0°.
(2) α scanning range: 20 to 90° (5° step)
(3) Target: Cu, Voltage: 50 kV, Current: 250 mA
(4) Dissipation slit: ¼°
(5) Scattering slit: 6 mm
(6) Divergence vertical limit slit: 5 mm

TABLE 3

| | Coating | |
|---|---|---|
| Sample No. | α angle (°) showing maximum intensity of X-ray intensity distribution of α axis in the pole figure for the (111) plane | α angle (°) showing maximum intensity of X-ray intensity distribution of α axis in the pole figure for the (200) plane |
| Present product 1 | 55 | 65 |
| Present product 2 | 65 | 75 |
| Present product 3 | 60 | 70 |
| Present product 4 | 55 | 75 |
| Present product 5 | 55 | 70 |
| Present product 6 | 60 | 65 |
| Present product 7 | 60 | 75 |
| Comparative product 1 | 40 | 80 |
| Comparative product 2 | 55 | 90 |

By using the coated cemented carbide tools of Present products 1 to 7, and Comparative products 1 and 2, a wet turning test was carried out under the conditions of a work piece material: Ni-based heat-resistant alloy Inconel 718, a cutting speed: 60 m/min, cutting depth: 0.7 mm, and feed: 0.3 mm/rev. Tool lifetime was judged with a maximum flank wear width VBmax=0.30 mm as a standard. When the tool did not reach the maximum flank wear width VBmax=0.30 mm at the cutting time of 10 minutes, the maximum flank wear width VBmax at the cutting time of 10 minutes was measured. These results are shown in Table 4.

TABLE 4

| Sample No. | Cutting time (min) | VBmax (mm) | Judgment of lifetime and damaged state |
|---|---|---|---|
| Present product 1 | 10 | 0.27 | Cutting possible |
| Present product 2 | 10 | 0.25 | Cutting possible |
| Present product 3 | 10 | 0.24 | Cutting possible |
| Present product 4 | 10 | 0.22 | Cutting possible |
| Present product 5 | 10 | 0.21 | Cutting possible |
| Present product 6 | 10 | 0.17 | Cutting possible |
| Present product 7 | 10 | 0.16 | Cutting possible |
| Comparative product 1 | 7 | 0.30 | Life passed due to remarkable wear |
| Comparative product 2 | 9 | Fracture | Life passed due to fracture |

As shown in Table 4, in Comparative product 1, the maximum flank wear width became 0.30 mm at a cutting time of 7 minutes so that its life was passed, and in Comparative product 2, it fractured at a cutting time of 9 minutes so that its life was passed. Present products 1 to 7 could be processed at a cutting time of 10 minutes, and further cutting was possible. Among Present products, the coating of Present product 6 contains Al, Cr and Si, and that of Present product 7 contains Al, Ti and Si, so that they showed particularly excellent wear resistance.

Example 2

As a substrate, an insert made of a cemented carbide corresponding to S10 with a shape of CNMG120408 was prepared. With regard to Present products, a metal target corresponding to a metal element and an Si element of a coating shown in Table 5 was charged in an AIP device. The substrate was charged in the AIP device, a substrate temperature was raised by a heater to 650° C., and Ar gas bombardment was carried out to the substrate. A starting gas(es) selected from Ar, $N_2$ and $CH_4$ depending on the composition of the coating was introduced into the AIP device, and by adjusting a pressure to 3.5 Pa, coating was carried out by the first coating step at a substrate bias voltage: −30 to −60V, and an arc discharge current: 150 A during the time shown in Table 6. After completion of the coating at the first coating step, while maintaining the pressure, the substrate temperature was lowered to 500° C., and the substrate bias voltage was gradually adjusted from −30 to −60V to −80 to −100V, and coating was carried out by the second coating step at a substrate bias voltage: −80 to −100V, and an arc discharge current: 130 A during the time shown in Table 6.

With regard to Comparative product 3, a metal target corresponding to the composition of the metal elements of the film shown in Table 5 was charged in the AIP device, the substrate was placed in the AIP device in the same manner as in Present products, a substrate temperature was raised by a heater to 600° C., and after subjecting to Ar gas bombardment to the substrate in the same manner as in Present products, a mixed gas of Ar and $N_2$ was introduced into the AIP device to adjust a pressure to 2 Pa, and coating was carried out under the coating conditions at a substrate bias voltage: −50V, and an arc discharge current: 150 A to provide a coating.

With regard to the composition of the coating coated on the surface of the substrate, measurement was carried out from the surface of the coating by using an energy dispersive X-ray spectrometer (EDS). With regard to the average film thickness of the coating coated on the surface of the substrate, the respective samples were cut, and the cross-sectional surface obtained by mirror polishing the cross-sectional surface was observed by an optical microscope and measured. These values are also shown in Table 5.

TABLE 5

| Sample No. | Coating Composition (Atomic ratio) | Average film thickness (μm) |
|---|---|---|
| Present product 8 | $(Al_{0.45}Ti_{0.55})N$ | 3 |
| Present product 9 | $(Al_{0.50}Ti_{0.50})N$ | 3 |
| Present product 10 | $(Al_{0.70}Ti_{0.30})N$ | 3 |
| Present product 11 | $(Al_{0.60}Ti_{0.40})N$ | 3 |
| Present product 12 | $(Al_{0.20}Ti_{0.50}Cr_{0.25}Si_{0.05})N$ | 2.5 |
| Present product 13 | $(Al_{0.30}Ti_{0.30}Cr_{0.30}Si_{0.10})N$ | 2.5 |
| Present product 14 | $(Al_{0.60}Ti_{0.29}Cr_{0.10}Si_{0.01})N$ | 2.5 |
| Present product 15 | $(Al_{0.55}Ti_{0.30}Cr_{0.10}Si_{0.05})N$ | 2.5 |
| Comparative product 3 | $(Al_{0.50}Ti_{0.50})N$ | 3 |

TABLE 6

| | Coating conditions | | | |
|---|---|---|---|---|
| | First coating step | | Second coating step | |
| Sample No. | Substrate bias voltage (V) | Time (min) | Substrate bias voltage (V) | Time (min) |
| Present product 8 | −50 | 15 | −100 | 180 |
| Present product 9 | −40 | 15 | −90 | 180 |
| Present product 10 | −40 | 15 | −90 | 180 |
| Present product 11 | −40 | 15 | −90 | 180 |
| Present product 12 | −30 | 15 | −80 | 150 |
| Present product 13 | −30 | 15 | −80 | 150 |
| Present product 14 | −30 | 15 | −80 | 150 |
| Present product 15 | −30 | 15 | −80 | 150 |

With regard to the coatings of Present products 8 to 15 and Comparative product 3, when X-ray diffraction measurement by the 2θ/θ scanning method was carried out by using an X-ray diffraction analyzer RINT-TTRIII available from RIGAKU CORPORATION, then the coatings of all the samples were confirmed to be a cubic NaCl type structure. Further, an X-ray intensity distribution of an α axis in the pole figure for the (111) plane and the (200) plane of the coatings of the whole samples were measured by using an X-ray diffraction analyzer RINT-TTRIII available from RIGAKU CORPORATION in the same manner as in Example 1. The measurement results are shown in Table 7.

TABLE 7

| | Coating | |
|---|---|---|
| Sample No. | α angle (°) showing maximum intensity of X-ray intensity distribution of α axis in the pole figure for the (111) plane | α angle (°) showing maximum intensity of X-ray intensity distribution of α axis in the pole figure for the (200) plane |
| Present product 8 | 55 | 70 |
| Present product 9 | 55 | 75 |
| Present product 10 | 55 | 75 |
| Present product 11 | 60 | 70 |
| Present product 12 | 50 | 75 |
| Present product 13 | 55 | 75 |
| Present product 14 | 60 | 70 |
| Present product 15 | 60 | 70 |
| Comparative product 3 | 40 | 80 |

By using the coated cemented carbide tools of Present products 8 to 15 and Comparative product 3, a wet turning test was carried out under the conditions of a work piece material: Ni-based heat-resistant alloy Inconel 718, a cutting speed: 75 m/min, cutting depth: 1.0 mm, and feed: 0.2 mm/rev. Tool lifetime was judged by a cutting time until chipping or fracture was generated, and when no chipping or fracture was generated, it was judged by a cutting time until the maximum flank wear width VBmax=0.30 mm. These results are shown in Table 8.

TABLE 8

| Sample No. | Tool lifetime (min) | Damaged state |
|---|---|---|
| Present product 8 | 10 | Chipping |
| Present product 9 | 14 | Normal wear (VBmax = 0.30 mm) |
| Present product 10 | 15 | Normal wear (VBmax = 0.30 mm) |
| Present product 11 | 18 | Normal wear (VBmax = 0.30 mm) |
| Present product 12 | 11 | Chipping |
| Present product 13 | 14 | Normal wear (VBmax = 0.30 mm) |

TABLE 8-continued

| Sample No. | Tool lifetime (min) | Damaged state |
|---|---|---|
| Present product 14 | 16 | Normal wear (VBmax = 0.30 mm) |
| Present product 15 | 17 | Normal wear (VBmax = 0.30 mm) |
| Comparative product 3 | 7 | Fractured |

As shown in Table 8, life of Comparative product 3 was passed with a cutting time of 7 minutes, but Present products 8 to 15 could be processed with a cutting time of 10 minutes or longer, which showed 1.4-fold or more tool lifetime as compared with that of Comparative product 3. Among Present products 8 to 15, Present products 9 to 11 and 13 to 15 showed 2-fold or more of tool lifetime to that of Comparative product 3.

Example 3

As a substrate, an insert made of a cemented carbide corresponding to S10 with a shape of CNMG120408 was prepared. With regard to Present products, a metal target corresponding to metal elements of a coating shown in Table 9 was charged in an AIP device. The substrate was charged in the AIP device, a substrate temperature was raised by a heater to 650° C., and Ar gas bombardment was carried out to the substrate. A starting gas(es) selected from Ar, $N_2$ and $CH_4$ depending on the composition of the coating was introduced into the AIP device, and by adjusting a pressure to 3.5 Pa, coating was carried out by the first coating step at a substrate bias voltage: −30 to −50V, and an arc discharge current: 120 to 160 A during the time shown in Table 10. After completion of the coating at the first coating step, while maintaining the pressure, the substrate temperature was lowered to 500° C., and the substrate bias voltage was gradually adjusted from −30 to −50V to −80 to −110V, and coating was carried out by the second coating step at a substrate bias voltage: −80 to −110V, and an arc discharge current: 130 to 170 A during the time shown in Table 10.

With regard to Comparative product 4, a metal target corresponding to the composition of the metal elements of the film shown in Table 9 was charged in the AIP device, the substrate was placed in the AIP device in the same manner as in Present products, a substrate temperature was raised by a heater to 600° C., and after subjecting to Ar gas bombardment to the substrate in the same manner as in Present products, a mixed gas of Ar and $N_2$ was introduced into the AIP device to adjust a pressure to 2 Pa, and coating was carried out under the coating conditions at a substrate bias voltage: −50V, and an arc discharge current: 150 A to provide a coating.

With regard to the composition of the coating coated on the surface of the substrate, measurement was carried out from the surface of the coating by using an energy dispersive X-ray spectrometer (EDS). With regard to the average film thickness of the coating coated on the surface of the substrate, the respective samples were cut, and the cross-sectional surface obtained by mirror polishing the cross-sectional surface was observed by an optical microscope and measured. These values are also shown in Table 9.

TABLE 9

| | Coating | |
|---|---|---|
| Sample No. | Composition (Atomic ratio) | Average film thickness (μm) |
| Present product 16 | $(Al_{0.45}Ti_{0.55})N$ | 3 |
| Present product 17 | $(Al_{0.50}Ti_{0.50})N$ | 3 |
| Present product 18 | $(Al_{0.60}Ti_{0.40})N$ | 3 |
| Present product 19 | $(Al_{0.60}Ti_{0.40})N$ | 3 |
| Present product 20 | $(Al_{0.55}Ti_{0.05}Cr_{0.3}Si_{0.1})(C_{0.5}N_{0.5})$ | 3 |
| Present product 21 | $(Al_{0.4}Ti_{0.4}Cr_{0.15}Si_{0.05})(C_{0.3}N_{0.7})$ | 3 |
| Present product 22 | $(Al_{0.5}Ti_{0.38}Cr_{0.08}Si_{0.04})N$ | 3 |
| Present product 23 | $(Al_{0.55}Ti_{0.4}Si_{0.05})(C_{0.1}N_{0.9})$ | 3 |
| Comparative product 4 | $(Al_{0.50}Ti_{0.50})N$ | 3 |

TABLE 10

| | Coating conditions | | | | | |
|---|---|---|---|---|---|---|
| | First coating step | | | Second coating step | | |
| Sample No. | Substrate bias voltage (V) | Arc current (A) | Time (min) | Substrate bias voltage (V) | Arc current (A) | Time (min) |
| Present product 16 | −50 | 160 | 15 | −100 | 130 | 180 |
| Present product 17 | −30 | 120 | 15 | −90 | 170 | 140 |
| Present product 18 | −40 | 130 | 15 | −90 | 160 | 145 |
| Present product 19 | −40 | 145 | 15 | −90 | 155 | 150 |
| Present product 20 | −50 | 160 | 15 | −110 | 130 | 180 |
| Present product 21 | −35 | 120 | 15 | −90 | 160 | 145 |
| Present product 22 | −35 | 130 | 15 | −90 | 160 | 145 |
| Present product 23 | −35 | 145 | 15 | −80 | 155 | 150 |

With regard to the coatings of Present products 16 to 23 and Comparative product 4, when X-ray diffraction measurement by the 2θ/θ scanning method was carried out by using an X-ray diffraction analyzer RINT-TTRIII available from RIGAKU CORPORATION, then the coatings of all the samples were confirmed to be a cubic NaCl type structure. Further, an X-ray intensity distribution of an α axis in the pole figure for the (111) plane and the (200) plane of the coatings of the whole samples were measured by using an X-ray diffraction analyzer RINT-TTRIII available from RIGAKU CORPORATION in the same manner as in Example 1. The measurement results are shown in Table 11.

TABLE 11

| | Coating | | |
|---|---|---|---|
| Sample No. | α angle (°) showing maximum intensity of X-ray intensity distribution of α axis in the pole figure for the (111) plane | α angle (°) showing maximum intensity of X-ray intensity distribution of α axis in the pole figure for the (200) plane | Full width at half maximum intensity (°) at (200) plane peak |
| Present product 16 | 55 | 70 | 1.80 |
| Present product 17 | 55 | 75 | 1.60 |

TABLE 11-continued

| Sample No. | Coating | | |
|---|---|---|---|
| | α angle (°) showing maximum intensity of X-ray intensity distribution of α axis in the pole figure for the (111) plane | α angle (°) showing maximum intensity of X-ray intensity distribution of α axis in the pole figure for the (200) plane | Full width at half maximum intensity (°) at (200) plane peak |
| Present product 18 | 55 | 75 | 1.20 |
| Present product 19 | 60 | 70 | 0.90 |
| Present product 20 | 55 | 75 | 1.90 |
| Present product 21 | 55 | 75 | 1.50 |
| Present product 22 | 60 | 75 | 1.30 |
| Present product 23 | 55 | 70 | 1.00 |
| Comparative product 4 | 40 | 80 | 0.50 |

By using the coated cemented carbide tools of Present products 16 to 23 and Comparative product 4, a wet turning test was carried out under the conditions of a work piece material: Ni-based heat-resistant alloy Inconel 718, a cutting speed: 90 m/min, cutting depth: 0.5 mm, and feed: 0.15 mm/rev. Tool lifetime was judged by a cutting time until the maximum flank wear width VBmax=0.20 mm. These results are shown in Table 12.

TABLE 12

| Sample No. | Tool lifetime (min) | Damaged state |
|---|---|---|
| Present product 16 | 11 | Normal wear (VBmax = 0.20 mm) |
| Present product 17 | 14 | Normal wear (VBmax = 0.20 mm) |
| Present product 18 | 16 | Normal wear (VBmax = 0.20 mm) |
| Present product 19 | 15 | Normal wear (VBmax = 0.20 mm) |
| Present product 20 | 11 | Normal wear (VBmax = 0.20 mm) |
| Present product 21 | 14 | Normal wear (VBmax = 0.20 mm) |
| Present product 22 | 15 | Normal wear (VBmax = 0.20 mm) |
| Present product 23 | 15 | Normal wear (VBmax = 0.20 mm) |
| Comparative product 4 | 7 | Normal wear (VBmax = 0.20 mm) |

As shown in Table 12, life of Comparative product 4 was passed with a cutting time of 7 minutes, but Present products 16 to 23 could be processed with a cutting time of 11 minutes or longer, which showed 1.5-fold or more tool lifetime as compared with that of Comparative product 4. Among Present products, Present products 17, 18, 19, 21, 22 and 23 showed 2-fold or more of tool lifetime to that of Comparative product 4.

The invention claimed is:

1. A coated member comprising a substrate and a coating coated on the surface of the substrate, wherein:
   at least one layer of the coating is a hard film comprising a cubic metallic compound which comprises:
      at least one element selected from the elements of Groups 4, 5 and 6 of the Periodic Table, Al, Si, B, Y and Mn, and
      at least one element selected from C, N and O, and
   an X-ray intensity distribution of an α axis in a pole figure for a (111) plane of the hard film has a maximum intensity in an α angle range of 50 to 65°, and
   an X-ray intensity distribution of an α axis in a pole figure for a (200) plane of the hard film has a maximum intensity in an α angle range of 60 to 80°.

2. The coated member according to claim 1, wherein the hard film is a metallic compound layer comprising at least one metal element selected from Al, Si, Ti and Cr, and at least one non-metal element selected from C, N and O.

3. The coated member according to claim 2, wherein the hard film is at least one selected from the group consisting of TiN, TiC, TiCN, TiCNO, (TiNb)N, (TiZr)CN, (AlTi)N, (AlTi)C, (AlTi)(CN), (AlTi)(CNO), (AlCr)N, (AlCr)C, (AlCr)(CN), (AlCr)(CNO), (AlTiCr)N, (AlTiCr)C, (AlTiCr)(CN), (AlTiCr)(CNO), (AlTiSi)N, (AlTiSi)C, (AlTiSi)(CN), (AlTiSi)(CNO), (AlTiCrSi)N, (AlTiCrSi)C, (AlTiCrSi)(CN) and (AlTiCrSi)(CNO).

4. The coated member according to claim 2, wherein the hard film is a metallic compound layer represented by $(Al_a J_b)(C_x N_y)$
   wherein J represents one or both of Ti and Cr, a represents an atomic ratio of Al based on the sum of Al and J, b represents an atomic ratio of J based on the sum of Al and J, a and b satisfy $a+b=1$, $0.5 \leq a \leq 0.7$ and $0.3 \leq b \leq 0.5$, x represents an atomic ratio of C based on the sum of C and N, y represents an atomic ratio of N based on the sum of C and N, and both satisfy $x+y=1$, $0 \leq x \leq 1$ and $0 \leq y \leq 1$.

5. The coated member according to claim 4, wherein the hard film is at least one selected from the group consisting of $(Al_{0.50}Ti_{0.50})N$, $(Al_{0.55}Ti_{0.45})N$, $(Al_{0.60}Ti_{0.40})N$, $(Al_{0.70}Ti_{0.30})N$, $(Al_{0.60}Ti_{0.20}Cr_{0.20})N$ and $(Al_{0.50}Cr_{0.50})N$.

6. The coated member according to claim 2, wherein the hard film is a metallic compound layer represented by $(Al_c J_d Si_e)(C_z N_w)$
   wherein J represents one or both of Ti and Cr, c represents an atomic ratio of Al based on the sum of Al, J and Si, d represents an atomic ratio of J based on the sum of Al, J and Si, e represents an atomic ratio of Si based on the sum of Al, J and Si, c, d and e satisfy $c+d+e=1$, $0.3 \leq c \leq 0.6$, $0.3 \leq d \leq 0.6$ and $0.01 \leq e \leq 0.1$, z represents an atomic ratio of C based on the sum of C and N, w represents an atomic ratio of N based on the sum of C and N, and each satisfy $z+w=1$, $0 \leq z \leq 1$ and $0 \leq w \leq 1$.

7. The coated member according to claim 6, wherein the hard film is at least one selected from the group consisting of $(Al_{0.45}Ti_{0.40}Si_{0.15})N$, $(Al_{0.55}Ti_{0.35}Si_{0.10})N$, $(Al_{0.60}Ti_{0.35}Si_{0.05})N$, $(Al_{0.30}Cr_{0.30}Ti_{0.30}Si_{0.10})N$, $(Al_{0.45}Cr_{0.30}Ti_{0.20}Si_{0.05})N$, $(Al_{0.55}Ti_{0.30}Cr_{0.10}Si_{0.05})N$, $(Al_{0.60}Ti_{0.29}Cr_{0.10}Si_{0.01})N$, $(Al_{0.55}Ti_{0.05}Cr_{0.3}Si_{0.1})(C_{0.5}N_{0.5})$, $(Al_{0.4}Ti_{0.4}Cr_{0.15}Si_{0.05})(C_{0.3}N_{0.7})$, $(Al_{0.5}Ti_{0.38}Cr_{0.08}Si_{0.04})N$ and $(Al_{0.55}Ti_{0.4}Si_{0.05})(C_{0.1}N_{0.9})$.

8. The coated member according to claim 4, wherein a full width at half maximum intensity of the (200) plane diffraction line of the hard film is 0.90 to 1.60°.

9. The coated member according to claim 1, wherein an average film thickness of whole coating is 0.1 to 15 μm.

10. The coated member according to claim 1, wherein the hard film is formed by charging a substrate in an arc ion plating device, heating a substrate temperature to 500 to 750° C. by a heater, subjecting the substrate to an Ar gas bombardment, a first coating step of introducing Ar, $N_2$, $O_2$, $CH_4$, $C_2H_2$ or a mixed gas thereof in the device to adjust a pressure therein to 2 to 5 Pa, applying a direct current bias voltage: −20 to −70V and an arc discharge current: 80 to 180 A to the substrate to coat a hard film corresponding to 3 to 15% of an average film thickness by adjusting a time, then, lowering the substrate temperature to 450 to 700° C., while maintaining the pressure, gradually applying a substrate bias voltage from −20 to −70V, to the substrate bias voltage of −80 to −180V, a second coating step of the substrate bias voltage of −80 to −180V and an arc discharge current: 130 to 180 A, to coat the hard film corresponding to 85 to 97% of the average film thickness by adjusting the time.

11. The coated member according to claim 1, wherein the hard film is formed by charging a substrate in an arc ion plating device, heating a substrate temperature to 500 to 700° C. by a heater, subjecting the substrate to an Ar gas bombardment, a first coating step of introducing Ar, $N_2$, $O_2$, $CH_4$, $C_2H_2$ or a mixed gas thereof in the device to adjust a pressure therein to 2 to 4 Pa, applying a direct current bias voltage: −30 to −60V and an arc discharge current: 100 to 150 A to the substrate to coat a hard film corresponding to 3 to 15% of an average film thickness by adjusting a time, then, lowering the substrate temperature to 450 to 550° C., while maintaining the pressure, gradually applying a substrate bias voltage from −20 to −70V, to the substrate bias voltage of −80 to −120V, a second coating step of the substrate bias voltage of −80 to −120V and an arc discharge current: 150 to 180 A, to coat the hard film corresponding to 85 to 97% of the average film thickness by adjusting the time.

12. A cutting tool comprising the coated member according to claim 1.

13. The coated member according to claim 5, wherein a full width at half maximum intensity of the (200) plane diffraction line of the hard film is 0.90 to 1.60°.

14. The coated member according to claim 6, wherein a full width at half maximum intensity of the (200) plane diffraction line of the hard film is 0.90 to 1.60°.

15. The coated member according to claim 7, wherein a full width at half maximum intensity of the (200) plane diffraction line of the hard film is 0.90 to 1.60°.

16. The coated member according to claim 1, wherein the hard film is formed by:
(a) placing the substrate in a device;
(b) heating the substrate to a first temperature which is 500 to 750° C. and subjecting the substrate to an Ar gas bombardment;
(c) after subjecting the substrate to Ar gas bombardment, introducing into the device Ar, $N_2$, $O_2$, $CH_4$, $C_2H_2$ or a mixed gas thereof and adjusting a pressure in the device to 2 to 5 Pa
(d) initially coating the substrate by applying, for a first time period, a direct current bias voltage of −20 to −70V and an arc discharge current of 80 to 180 A;
(e) lowering the substrate temperature to a second temperature which is 450 to 700° C. while maintaining the pressure and changing the substrate bias voltage to −80 to −180V; and
(f) further coating the substrate by applying, for second time period, a substrate bias voltage of −80 to −180V and an arc discharge current of 130 to 180 A.

17. The coated member according to claim 16, wherein the hard film is formed by:
in step (b), heating the substrate to a first temperature which is 500 to 700° C.;
in step (c), adjusting the pressure in the device to 2 to 4 Pa;
in step (d), applying a direct current bias voltage of −30 to −60V and an arc discharge current of 100 to 150 A;
in step (e), lowering the substrate temperature to a second temperature which is 450 to 550° C. while maintaining the pressure and changing the substrate bias voltage to −80 to −120V;
in step (f), applying a substrate bias voltage of −80 to −180V and an arc discharge current of 150 to 180 A.

18. A method of coating a cutting tool substrate with a hard film to form a coated cutting tool whose X-ray intensity distribution of an α axis in a pole figure for a (111) plane of the hard film has a maximum intensity in an α angle range of 50 to 65°, and whose X-ray intensity distribution of an α axis in a pole figure for a (200) plane of the hard film has a maximum intensity in an α angle range of 60 to 80°, the method comprising:
(a) placing the substrate in a device;
(b) heating the substrate to a first temperature which is 500 to 750° C. and subjecting the substrate to an Ar gas bombardment;
(c) after subjecting the substrate to Ar gas bombardment, introducing into the device Ar, $N_2$, $O_2$, $CH_4$, $C_2H_2$ or a mixed gas thereof and adjusting a pressure in the device to 2 to 5 Pa
(d) initially coating the substrate by applying, for a first time period, a direct current bias voltage of −20 to −70V and an arc discharge current of 80 to 180 A;
(e) lowering the substrate temperature to a second temperature which is 450 to 700° C. while maintaining the pressure and changing the substrate bias voltage to −80 to −180V;
(f) further coating the substrate by applying, for second time period, a substrate bias voltage of −80 to −180V and an arc discharge current of 130 to 180 A;
wherein:
the first and second time periods are selected such that 3 to 15% of a thickness of the hard film is applied during step (d) and about 85 to 97% of the thickness of the hard film is applied during step (f).

19. The method according to claim 18, comprising:
in step (b), heating the substrate to a first temperature which is 500 to 700° C.;
in step (c), adjusting the pressure in the device to 2 to 4 Pa;
in step (d), applying a direct current bias voltage of −30 to −60V and an arc discharge current of 100 to 150 A;
in step (e), lowering the substrate temperature to a second temperature which is 450 to 550° C. while maintaining the pressure and changing the substrate bias voltage to −80 to −120V;
in step (f), applying a substrate bias voltage of −80 to −180V and an arc discharge current of 150 to 180 A.

20. The method according to claim 18, wherein:
the substrate is placed in an arc ion plating device;
the first time period is between 10 to 20 minutes; and
the second time period is between 60 to 180 minutes.

* * * * *